_United States Patent_ [19]

Carbrey

[11] Patent Number: 4,573,038

[45] Date of Patent: Feb. 25, 1986

[54] LINEAR CODEC WITH DUAL DIVIDER

[75] Inventor: Robert L. Carbrey, Boulder, Colo.

[73] Assignee: AT&T Information Systems, Inc., Holmdel, N.J.

[21] Appl. No.: 582,901

[22] Filed: Feb. 23, 1984

[51] Int. Cl.[4] .............................................. H03K 13/02
[52] U.S. Cl. ......................... 340/347 C; 340/347 DD; 340/347 DA; 340/347 M
[58] Field of Search ................ 340/347 AD, 347 DA, 340/347 M, 347 C

[56] References Cited

U.S. PATENT DOCUMENTS

| 3,449,741 | 6/1969 | Egerton, Jr. | 340/347 |
|---|---|---|---|
| 3,469,255 | 9/1969 | Hoffman et al. | 340/347 |
| 3,626,408 | 12/1971 | Carbrey | 340/347 AD |
| 4,185,275 | 1/1980 | Carbrey | 340/347 |
| 4,291,298 | 9/1981 | Carbrey | 340/347 |

FOREIGN PATENT DOCUMENTS 1593686 6/1970 France .

OTHER PUBLICATIONS

IEEE Journal of Solid-State Circuits, vol. SC-16, No. 4, Aug. 1981, "A Single-Chip Codec with Switched-Capacitor Filters", Atsushi Iwata, Hiroyuki Kikuchi, Kuniharu Uchimura, Akihiko Morino, and Masahiko Nakajima, pp. 315-321.

IEEE Journal of Solid-State Circuits, vol. SC-16, No. 4, Aug. 1981, "A Single-Chip CMOS PCM Codec with Filters", Douglas G. Marsh, Bhupendra K. Ahuja, Toshio Misawa, Mirmira R. Dwarakanath, Paul E. Fleischer and Veikko R. Saari, pp. 308-315.

_Primary Examiner_—William M. Shoop, Jr.
_Assistant Examiner_—Saul M. Bergmann
_Attorney, Agent, or Firm_—H. T. Brendzel

[57] ABSTRACT

Disclosed is a charge redistribution codec employing a two capacitor network for developing a progression of reference voltages having a binary relationship to each other for each analog input sample to be encoded. Linear encoding of input samples is achieved with the use of two such charge redistribution networks, with one developing positive reference voltages and the other developing negative reference voltages. Analog input samples are placed in an encoding capacitor and based on the polarity of the voltage across the capacitor either a positive or a negative charge is added iteratively to the capacitor in the direction of driving the voltage across that capacitor to zero. A code is developed by assigning at each iteration one value to an output code bit when a positive voltage is added and the opposite value to the bit when a negative voltage is added.

Chord-law encoding is achieved in a similar manner except that the output code includes a sign bit, a chord count and a linear code for describing the signal within the chord. Operationally, as with linear encoding two reference voltage generating circuits are employed to provide the positive and negative reference voltages. In addition, means are provided for adding an offset voltage to increase the magnitude of the input sample for assigning a sign bit based on the initial polarity of the input sample and for chord counting.

5 Claims, 6 Drawing Figures

LINEAR CODEC WITH DUAL DIVIDER

TECHNICAL FIELD

This invention concerns analog-to-digital coders and decoders and, more particularly, to coders and decoders (codecs) of the capacitive charge redistribution type.

BACKGROUND OF THE INVENTION

In my U.S. Pat. No. 4,185,275 issued Jan. 22, 1980, I disclosed a multi-stage digital-to-analog converter which employs a sampling capacitor for each stage of coding. In that disclosure, a reference terminal of the sampling capacitor is connected to a tap of a precision resistive divider to provide a binary-weighted reference voltage for a stage, and the other terminal of the sampling capacitor receives the input sample to be quantized by the stage. The analog sample applied to the stage is compared to the reference voltage for the stage and when the input sample is larger than the reference voltage a flip-flop is set for the stage and the reference terminal of the sampling capacitor is disconnected from the reference tap and clamped to ground to "subtract" an increment from the sample. When the voltage of the input analog sample is lower than the reference voltage, the flip-flop is not set and the reference terminal of the capacitor is not clamped to ground. In either event, the input terminal of the sampling capacitor is then connected to the input of the next stage where the process is repeated, except that the reference terminal of the second stage's capacitor is connected to a tap of the resistive divider having a lower binary-weighted reference voltage.

While the foregoing circuit is satisfactory for many applications, it would be advantageous to employ integrated CMOS or NMOS technology, and in these technologies it is difficult to provide a precision resistive divider.

The precision resistive voltage divider is eliminated in my copending application, Ser. No. 504,900 filed June 16, 1983, by the use of a switched capacitor divider network. Positive and negative "binary weights" are developed at each stage in the division process and selection of either the positive or negative bit weight at a stage allows a binary fraction to be added or subtracted.

As with the coder of my previously cited patent, the number of stages in the coder of my copending application advantageously need only be equal in number to the number of desired digit positions in the output. This is in contrast to the present practice where one comparator is required for each quantizing level. The stages are arranged to operate in a "wave" or "pipeline" sequence under the control of a plurality of high speed waveforms so that each stage decodes its respective binary digit for one analog sample while the other stages are decoding their respective binary digits of other analog samples. The result is that in each clock period each capacitor is gainfully employed in the encoding process, yielding a very fast encoder that is suitable for video applications.

While the invention disclosed in my above-mentioned copending application is very useful and has numerous advantages over the prior art in addition to the ones described above, it does require a comparator and a number of capacitors for each stage.

In my U.S. Pat. No. 4,291,298, issued Sept. 22, 1981, I disclosed a codec that requires fewer capacitors. It operates by developing an upper and a lower limit voltage on two capacitors and by averaging those voltages to form a trial voltage that is compared to the input analog voltage. The trial voltage replaces one of the limit voltages in accordance with the comparison, and the averaging and comparing steps are repeated to iteratively bring the trial voltage closer to the analog input voltage.

This codec has the advantage of employing few capacitors but it requires the use of buffer amplifiers to transfer the binary voltages to the averaging means. Unity average gain and zero offset in the buffers must be controlled automatically or by a manual adjustment.

SUMMARY OF THE INVENTION

It is an object of this invention to enhance my charge redistribution codecs by employing few capacitors and thereby achieving small size, low manufacturing cost, high accuracy and good reliability.

It is a further object of this invention to eliminate the gain and zero offset concerns of my previously disclosed codec.

It is a still further object of this invention is to realize a codec that operates in both linear and chord-law modes.

These and other objects are achieved, in accordance with the principles of my invention, with a codec which employs only two equal size capacitors to develop each polarity of the necessary reference voltages. One capacitor serves as the charge source capacitor and the other capacitor serves as the recipient of charge from the source capacitor and as the provider of the reference charge to the codec. The reference voltages are generated by cyclically discharging the reference-charge capacitor and redistributing the charge of the source capacitor between the two capacitors. With each cycle the generated reference voltages are halved thus generating a sequence of binary reference voltages and associated charges for use within the codec. The reference charges on the reference-charge capacitor are utilized just prior to the discharge of the capacitor.

The encoding process is executed with the aid of two reference voltage generating circuits. One generates positive reference voltages and one generates negative reference voltages. Encoding ensues with the sampling of the input voltage and placing the sample on an encoding capacitor. Based on the polarity of the voltage across the encoding capacitor either a positive or a negative reference charge is added to the capacitor in the direction aimed at reducing to zero the absolute value of the charge on the capacitor.

Linear encoding of the input sample is achieved when following the above algorithm. Chord-law encoding is achieved by following the same charge reduction procedure (across the encoding capacitor) and, additionally, by counting the number of redistribution cycles (following the first cycle) before the sign across the encoding capacitor returns to its initial state. The resultant count indicates the chord in which the signal resides. Following the chord count, encoding continues for a selected number of redistribution cycles to provide linear encoding within the chord.

DETAILED DESCRIPTION

To best understand the modus operandi of the codec disclosed herein it is advantageous to first review the basic idea of developing reference voltages having binary amplitude relationships as described in my aforementioned copending application, and the departure therefrom in my present invention.

Figure 1:
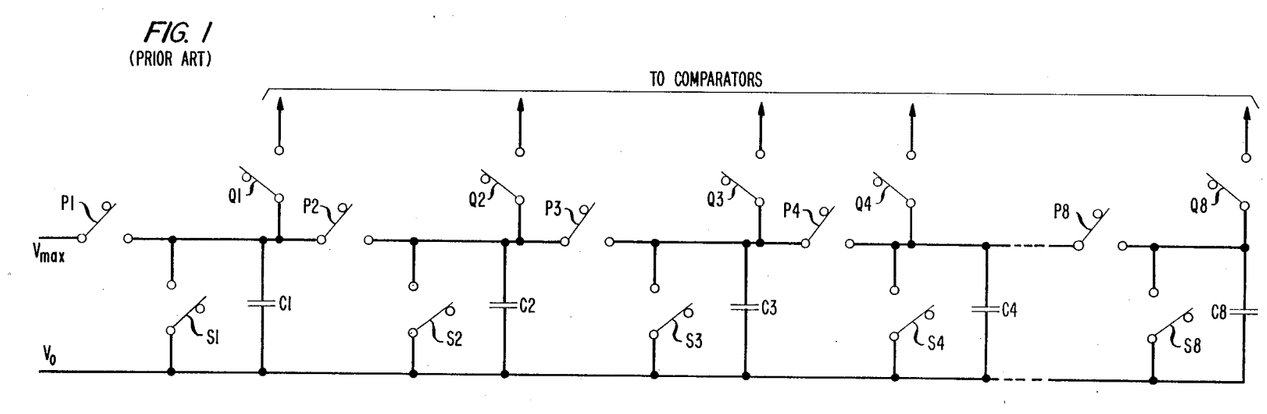
FIG. 1 depicts the prior art "pipeline" means for generating binary reference voltages.

FIG. 1, depicting my "pipeline" binary voltage generating circuit, comprises capacitors C1 through C8 (of equal value) and each capacitor develops a unique reference voltage. These voltages are developed through a sequence which begins when capacitor C1 is charged to $V_{max}$ through the closure of switch P1. (Strictly speaking, C1 is charged to $V_{max}-V_o$ where $V_o$ is the AC ground potential. Henceforth in this disclosure, all voltage references to voltage are made with respect to $V_o$). At the time C1 is charged to $V_{max}$, switches P2 and P3 are open and switch S2 is closed to discharge capacitor C2. At the next clock period, switch P2 is closed and the charge of C1 is distributed between C1 and C2, causing both capacitors to assume the voltage level $V_{max}/2$. Switches P3 and P4 are opened and switch S3 is closed to discharge capacitor C3. At the following clock period, the reference voltage of capacitor C1 ($V_{max}/2$) is applied to a comparator by switch Q1, switch P2 opens and switch P3 closes to distribute the charge of C2 between C2 and C3, causing both capacitors to assume the voltage level $V_{max}/4$. In this manner, each capacitor in the pipeline sequences through being discharged, being charged to a binary voltage level by the previous capacitor, distributing the charge between itself and the succeeding capacitor thereby reaching the next lower binary reference voltage level, and applying the reference level to a comparator.

While seeking a less expensive (and not necessarily a "pipeline") embodiment for a capacitive charge redistribution codec, I recalled that binary charge redistribution can be achieved with as few as two capacitors in a manner similar to that which I employed in my U.S. Pat. No. 4,291,298. That arrangement, shown in FIG. 2, comprises a capacitor C9 which I call the source capacitor, a capacitor C10 equal in value to C9 which I call the reference-charge capacitor and switches S9 through S12. At the beginning of a sequence, switch S9 charges capacitor C9 to $V_{max}$ while capacitor C10 is discharged to $V_o$ by switch S11. At the second clock period, switch S10 closes and the charge of capacitor C9 is distributed between capacitors C9 and C10, thereby bringing the voltage of the two capacitors to level $V_{max}/2$. At the third clock period, the $V_{max}/2$ reference voltage of capacitor C10 is applied to a comparator through switch S12 and that ends a redistribution cycle. At the next three clock period redistribution cycle, C10 is discharged to $V_o$ with the closure of switch S11, then C10 is charged to $V_{max}/4$ with the closure of switch S10 (redistributing the charge of capacitor C9, which is at level $V_{max}/2$), and the new reference voltage of C10 is again applied to a comparator with the closure of switch S12. In like manner, with each three clock period redistribution cycle the voltage of capacitor C9 is halved until C10 is charged to $V_{max}$ again.

Figure 2:
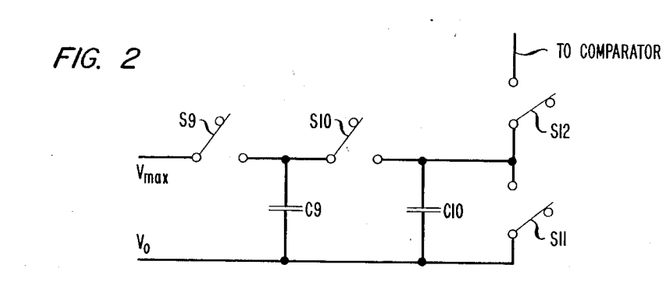
FIG. 2 shows a charge redistribution circuit for generating binary reference voltages in accordance with the principles of my invention.
Figure 3:
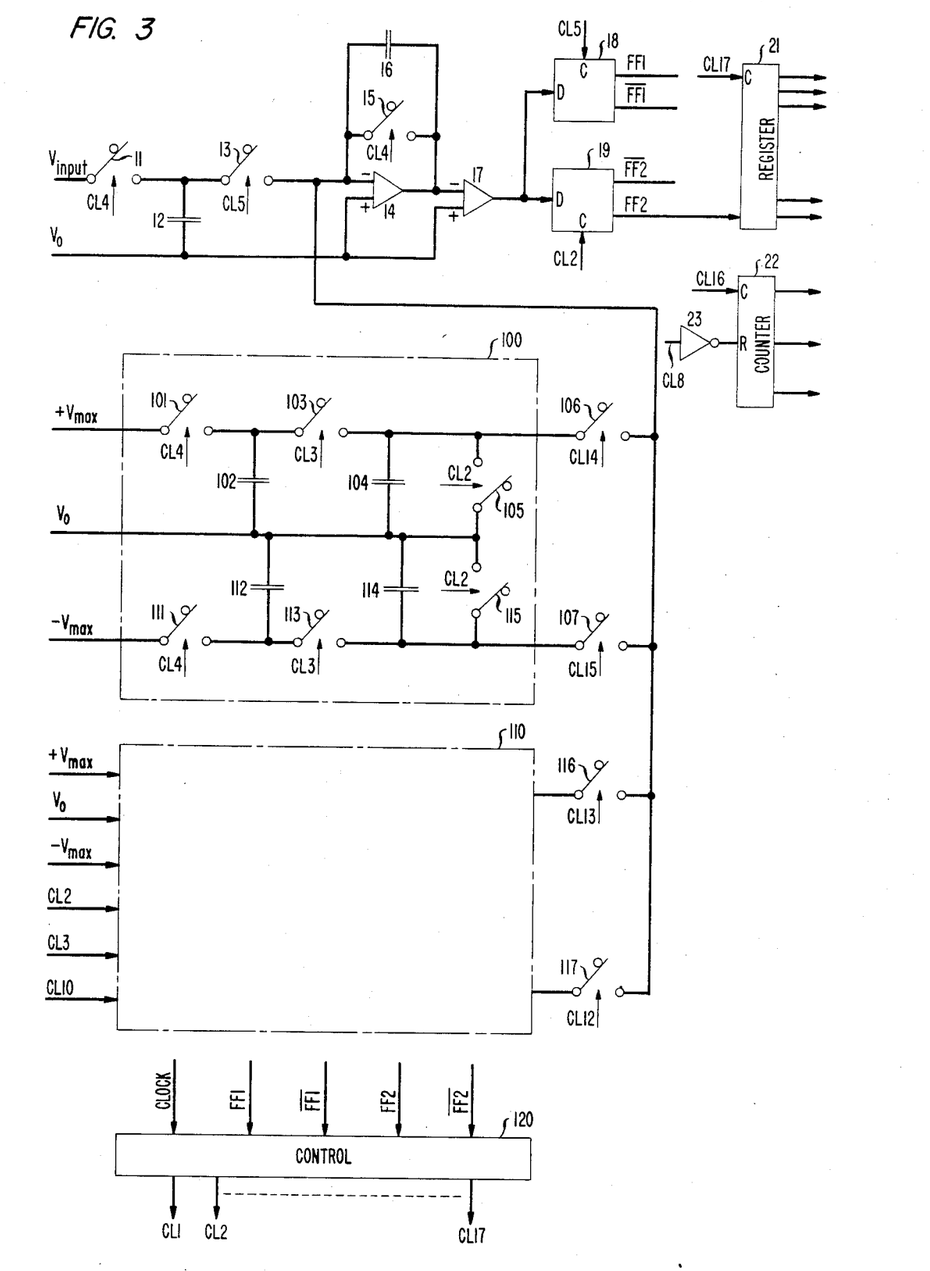
FIG. 3 is a block diagram showing a linear/chord-law codec employing the principles of my invention.

FIG. 3 depicts one embodiment of my invention, employing the reference voltage generating circuit of FIG. 2, which is capable of encoding incoming signals linearly or in accordance with chord-law principles. It can be viewed as comprising a control section (element 120), a digital encoding section (elements 18,19, and 21–23) and an analog decision section (remaining elements).

Analog Decision Section

Input signals in the analog decision section are applied to sampling switch 11, through which sampling capacitor 12 is charged with respect to the AC ground potential, $V_o$. The sampled voltage is applied to the negative input of operational amplifier 14 through switch 13 and the positive input of amplifier 14 is connected to $V_o$. Reference voltages are generated within elements 100 and 110 in accordance with the principles of the FIG. 2 circuit and applied to the same negative input of amplifier 14 via switches 106 and 107, and switches 116 and 117, respectively. The output of amplifier 14 is connected to one input of voltage comparator 17 which is shown symbolically as an amplifier. Voltage comparator 17 may be a National Semiconductor type LM-111 comparator. The output of amplifier 14 is also fed back to its own negative input through the parallel combination of capacitor 16 and switch 15 and thus, the value of the analog signal is stored across capacitor 16. Amplifier 17, whose positive input is connected to $V_o$, determines whether the output of amplifier 14 resulting from the coding operation is positive or negative with respect to $V_o$. That is, all negative signals of amplifier 14 are converted to logic level 1 and all positive signals of amplifier 14 are converted to logic level 0. These levels are compatible with the digital circuits which follow.

Elements 100 and 110 are basically the same structure. The only difference between them is that element 110 employs a control signal CL10 where element 100 employs a control signal CL4. The reasons for this difference are discussed hereinafter.

In element 100, capacitors 102 and 104 and switches 101, 103 and 105 form the binary reference voltage generating circuit as described in FIG. 2. The switch corresponding to S12 of FIG. 2 is switch 106, shown outside element 100. Capacitors 112 and 114 together with switches 111, 113, 115 and 107 (outside element 100) also form a binary reference voltage generating circuit as described in connection with FIG. 2. However, since switch 101 is connected to $V_{max}$ and switch 111 is connected to $-V_{max}$, the reference voltages which pass through switch 106 are positive while the reference voltages generated which pass through switch 107 are negative.

Element 110 operates identically to element 100 except that its input control signals in combination with the control signals on switches 116 and 117 provide only an initial sample offset to the input signal in chord-law operation, as described in greater detail below.

General Operation

In the linear mode, encoding of each input signal sample commences with the transfer of the charge on capacitor 12 onto capacitor 16. The polarity of the voltage across capacitor 16 is determined, and based on that determination either switch 106 or 107 is closed to drive the charge of capacitor 16 toward zero. The charge transferred through switch 106 (or 107) at the first iteration corresponds to the largest positive (or negative) binary reference voltage, resulting in a voltage across capacitor 16 that is either of unaltered polarity and smaller in magnitude, or of reversed polarity. At the next iteration the polarity of the voltage across capacitor 16 is again determined, and based on that determination the next lower binary reference voltage is again applied through either switch 106 or 107 to drive the charge across capacitor 16 toward zero. The subtraction of binary reference voltages (positive and negative) of successively lower amplitude in the direction of driving the charge on capacitor 16 toward zero (i.e., the number of iterations) is repeated as many times as desired to obtain the required encoding sensitivity.

An example may be useful. With 13 bit linear encoding of input signals there are $2^{13}$ or 8192 distinct levels to characterize a signal's amplitude and it is easiest to refer to input signals in terms of those levels or units. Table 1 depicts the linear encoding process for an input signal of +1011.5 units and for an input signal of −67.5 units.

TABLE 1

| | Linear Encoding | |
|---|---|---|
| cap 16 voltage | linear encoding | ref voltage applied |
| +1011.5 | 1 | −2048 |
| −1036.5 | 0 | +1024 |
| −12.5 | 0 | +512 |
| +499.5 | 1 | −256 |
| +243.5 | 1 | −128 |
| +115.5 | 1 | −64 |
| +51.5 | 1 | −32 |
| +19.5 | 1 | −16 |
| +3.5 | 1 | −8 |
| −4.5 | 0 | +4 |
| −0.5 | 0 | +2 |
| +1.5 | 1 | −1 |
| +0.5 | 1 | |
| −67.5 | 0 | +2048 |
| +1980.5 | 1 | −1024 |
| +956.5 | 1 | −512 |
| +444.5 | 1 | −256 |
| +188.5 | 1 | −128 |
| +6.5 | 1 | −64 |
| −3.5 | 0 | +32 |
| +28.5 | 1 | −16 |
| +12.5 | 1 | −8 |
| +4.5 | 1 | −4 |
| +0.5 | 1 | −2 |
| −1.5 | 0 | +1 |
| −0.5 | 0 | |

The basic concept in chord-law operation centers on relating the encoding granularity (step size) to the signal's magnitude. A signal of large magnitude is encoded with coarse granularity, while a signal of small magnitude is encoded with fine granularity. To define areas of different encoding granularity, the full dynamic range of input signals (−4095u to +4095u in a system that employs 13 bits for linear encoding) is divided into segments, or chords, that have a binary relationship to each other. (In a system having a dynamic range of −4095 to +4095 there are 8 chords on either side of zero.) From zero going in both directions, the closest chord (chord 111) spans 16 units from 0 to 16u, the next chord (chord 110) spans 32 units from 16u to 48u, the following chord (chord 101) spans 64 units from 48u to 112u, and so forth until the last chord (chord 000) spans 2048 units from 2032u to end. Linear encoding of signals within a chord with a fixed number of bits automatically sets the granularity for that chord.

To determine the chord in which an input signal belongs, one must simply compare the signal to the demarcation points between the chords (the absolute values of which are 2032u, 1008u, 496u, 240u, 112u, 48u, and 16u) and determine between which two demarcation points the signal resides. These determinations are made most easily by subtracting the demarcation point values from the signal value, but to implement that one must have the demarcation point values available. Interestingly, each of these values is 16 units less than a binary number and therefore a circuit that generates binary unit values can be employed. When such a circuit is employed, however, 16 units must be either subtracted from each level developed by the circuit or 16 units must be added to the magnitude of the input signal. In the embodiment described below I chose to add a 16 unit offset to the magnitude of the input signal. Table 2 below depicts the chord-law encoding process for a +1011.5 unit signal and for a −67.5 unit signal. For sake of simplicity the assignment of bits for the sign and for the linear encoding portion of the code is made the same way as for linear encoding. Other assignments, such as "0" sign bit to designate positive signals, can of course be made.

It may be observed that in Table 2 the first bit in the linear encoding is always equal to the sign bit. Therefore, the transmission of this bit (or of the sign bit) is superfluous. Chord counting in Table 2 begins with chord 0 and increments as long as the polarity of the voltage across capacitor 16 is different from the initial polarity (sign bit). Once incrementing stops, linear encoding commences.

TABLE 2

| | Chord-Law Encoding | | | |
|---|---|---|---|---|
| cap 16 voltage | sign | chord count | linear encoding | ref voltage applied |
| +1011.5 | 1 | 0 | | +16−2048 |
| −1020.5 | | 1 | | +1024 |
| +3.5 | | | 1 | −512 |
| −508.5 | | | 0 | +256 |
| −252.5 | | | 0 | +128 |
| −124.5 | | | 0 | +64 |
| −60.5 | | | 0 | |
| output: sign 1, chord count 001, linear 10000 | | | | |
| −67.5 | 0 | 0 | | −16+2048 |
| +1964.5 | | 1 | | −1024 |
| +940.5 | | 2 | | −512 |
| +428.3 | | 5 | | −256 |
| +172.5 | | 4 | | −128 |
| +44.5 | | 5 | | −64 |
| −19.5 | | | 0 | +32 |
| +12.5 | | | 1 | −16 |
| −3.5 | | | 0 | +8 |
| +4.5 | | | 1 | −4 |
| +0.5 | | | 1 | |
| ouput: sign 0, chord count 101, linear 01011 | | | | |

Digital Encoding Section

The encoding procedure, illustrated in Tables 1 and 2, is implemented in the digital encoding section. Flip-flop 18 captures the initial polarity of the voltage across capacitor 16 as reflected in the output of comparator 17 and flip-flop 19 stores the polarity after each encoding iteration as the voltage across capacitor 16 is driven towards 0. The stored polarity, FF2, is applied to shift register 21 which with proper controls provides the encoded output in the linear mode and the linear encoding portion of the output in the chord-law mode. Counter 22 provides the chord count output for the chord-law mode.

Control Section

Figure 5:
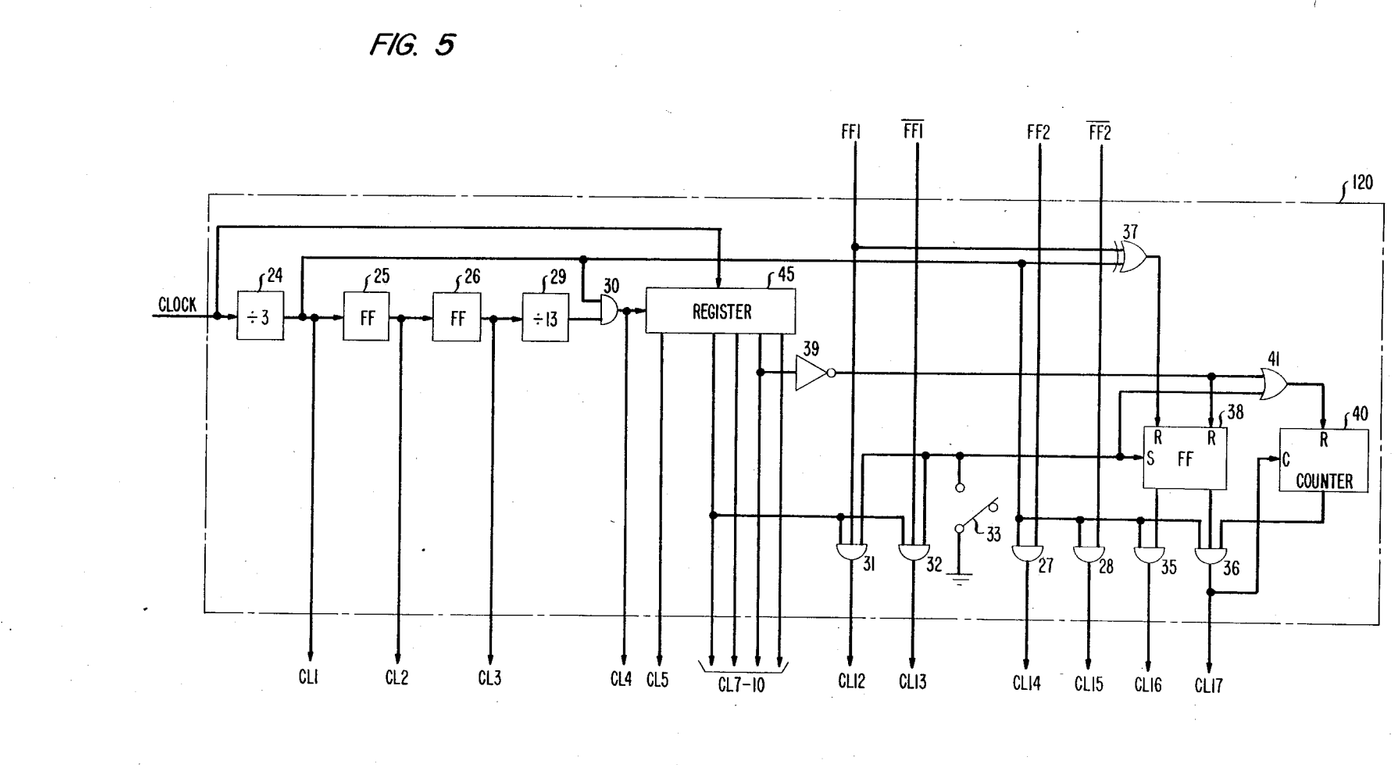
FIG. 5 shows the control section of the FIG. 3 encoder.

The control section, shown in detail in FIG. 5, develops the control signals required by the analog decision section and the control signals required by the digital encoding section.

Figure 4:
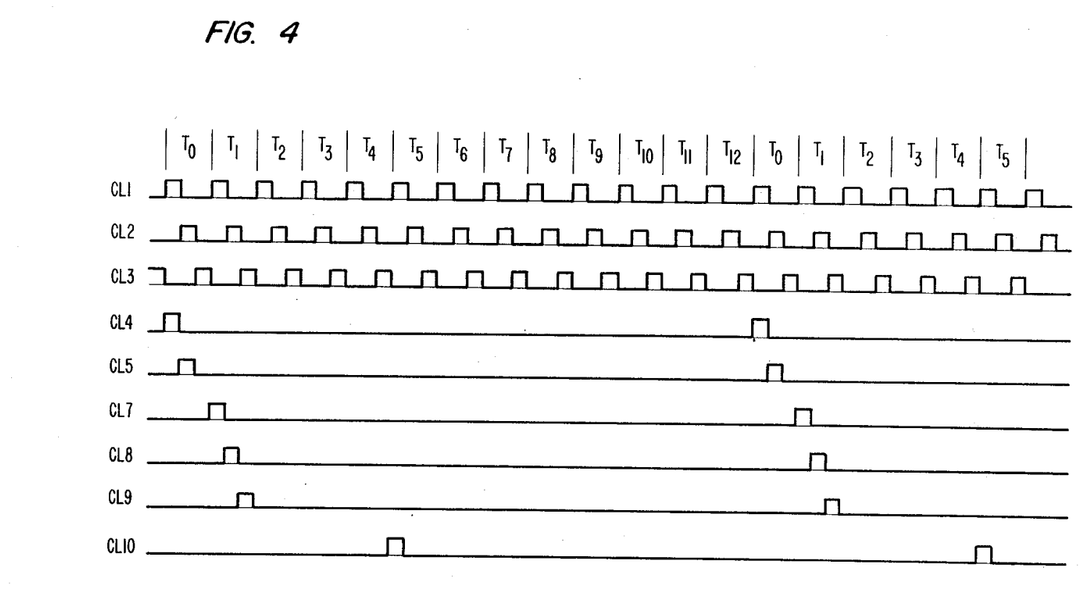
FIG. 4 is a timing diagram applicable to the encoder of FIG. 3.

As described in connection with the FIG. 2 circuit, the basic redistribution cycle time for developing binary reference voltages is three clock periods long and it includes a signal for utilizing the charge held by the reference-charge capacitor, a signal for discharging the reference-charge capacitor and a signal for distributing charges between the source capacitor and the reference-charge capacitor. These signals, which follow each other in cyclic succession, are depicted in the timing diagram of FIG. 4 as CL1, CL2, and CL3, respectively. In the control section (FIG. 5), signal CL1 is developed by dividing the basic clock by 3 in counter 24, CL2 is developed by delaying CL1 in flip-flop 25 and CL3 is developed by delaying CL2 in flip-flop 26.

Signal CL2 controls switches 105 and 115 in element 100 and corresponding switches in element 110. Signal CL3 control switches 103 and 113 in element 100 and corresponding switches in element 110. Signal CL1 closes either switch 106 or 107, depending on the state of flip-flop 19 (indicating polarity of voltage on capacitor 16) and the decision as to which switch to close is made in AND gates 27 and 28. Gate 27 is responsive to CL1 and to the true output of flip-flop 19 (FF2), applying its control signal CL14 to switch 106, and gate 28 is responsive to CL1 and to the inverse output of flip-flop 19 ($\overline{FF2}$), applying its control signal CL15 to switch 107.

With 13 bit encoding, an input signal may be sampled and encoded every 13 redistribution cycles. Divide by 13 counter 29 develops the sampling rate by dividing clock CL3, and the resultant three clock period pulse output, combined in AND gate 30 with CL1, develops control signal CL4. Control signal CL4 is used to sample the input signal through the closure of switch 11 and is also used to discharge capacitor 16 by the closure of switch 15. Once capacitor 16 is discharged, switch 13 closes one clock period later under control of CL5 and transfers the charge of capacitor 12 onto capacitor 16. Control signals CL5 and, CL7 through CL10 are obtained in the control section by accessing the 1st, 3rd, 4th, 5th and 15th tap of 16 bit shift register 45 which is responsive at its input to CL4. Register 45 is synchronized by the signal "clock", which is the input signal of divider 24.

Having transferred the input sample charge to capacitor 16, the initial polarity of the voltage across capacitor 16 (as reflected in the binary logic output of comparator 17) is detected and stored in flip-flop 18 by the trailing edge of the CL5 pulse at the clock input of flip-flop 18. Once the sign of the input signal is known, the correct offset signal charge may be added to capacitor 16 (when in the chord-law mode), and that is done with control signal CL7 operating through AND gates 31 and 32. In addition to being responsive to CL7, gate 31 is responsive to the true output of flip-flop 18 (FF1), developing thereby control signal CL12 for switch 117, and gate 32 is responsive to the inverse output of flip-flop 18, developing thereby control signal CL13 for switch 116. Gates 31 and 32 are also responsive to switch 33 which is user activated and arranged to disable gates 31 and 32 when linear mode operation is desired. This prevents addition of the offset charge.

It may be noted that CL7 coincides with CL1 which, conveniently, is the time when the first binary reference voltage may be subtracted from the voltage of capacitor 16. This implies an update via switches 101 and 114 of source capacitors 102 and 112 three clock periods earlier, with CL4. Also, utilizing the 16 unit charges at the CL7 time slot ($T_1$ iteration) means that nine redistribution cycles earlier (at previous $T_5$ iteration) the source capacitors within element 110 must be updated with CL10.

The clock to register 21 is always "on" in the linear mode but is turned "off" during the chord-law counting by counter 22, when counter 22 is incrementing. The turning "on" and "off" of the clock is accomplished in the control section with AND gates 35 and 36 under control of flip-flop 38. Gate 35 develops CL16 for incrementing counter 22 while gate 36 develops CL17 for advancing shift register 21.

Counter 22 is reset to 0 with CL8 (via inverter 23), which coincides with the down transition of CL1. One clock period later, control signal CL9 sets flip-flop 38 through inverter 39, enabling gate 35 and disabling gate 36, and through OR gate 41 resets divide-by-8 counter 40 to zero. At all states less than 4 counter 40 enables gate 36. Also one clock period after CL8, and every three clock periods henceforth, flip-flop 19 is reclocked with the down transition of CL2. As long as FF2 and FF1 are not equal, Exclusive OR gate 37 is at logic level 1 and counter 22 increments with CL16. As soon as they are equal, gate 37 sets flip-flop 38, gate 35 is disabled and gate 36 is enabled. Four clock periods later, when counter 40 is advanced to state 4 by CL17, gate 36 is disabled by counter 40. When operating in the linear mode, gate 36 is kept at the enabled state with switch 33, which maintains counter 40 at the zero state through OR gate 41 and maintains flip-flop 38 at the set state through a separate "reset" input.

Decoder

The decoder of my capactive charge redistribution codec, following the encoder principles described above, responds to incoming digital codes in a manner reversed from that of the encoding process. To wit, whatever output bit corresponds to subtraction of charge in the encoding process, in the decoder it corresponds to addition of charge. With reference to Table 1, for example, to obtain the value +1011.5 units from the linear code 1001111110011, the charges corresponding to the 0's in the code (1024u, 512u, 4u and 2u) are subtracted from the sum of the charges corresponding to the 1's in the code (2048u, 256u, 128u, 64u, 32u, 16u, 8u, 1u, and 0.5u). A similar operation follows in the chord-law mode. The sign and chord count code determine the initial charge developed, and the linear code adds to that charge appropriately. With reference to Table 2, for example, to obtain the value −67.5 units from the code 0,101,01011, the initial "0" directs the output signal to be negative, the 101 chord count determines that the chord's lower (absolute) demarcation point is 48 units, and the 01011 linear portion of the code calls for the addition of 32 unit and 8 unit negative charges and the subtraction of 16u, 4u and 2u negative charges.

In considering the hardware realization of a decoder it is useful to keep in mind the fact that although chord-law encoding generates fewer code bits than linear encoding, it can take as many redistribution cycles to develop as it takes to develop the linear code. The same holds true in the decoding process and hence the control signals developed for the encoder (FIG. 4) can directly be employed in the decoder.

Figure 6:
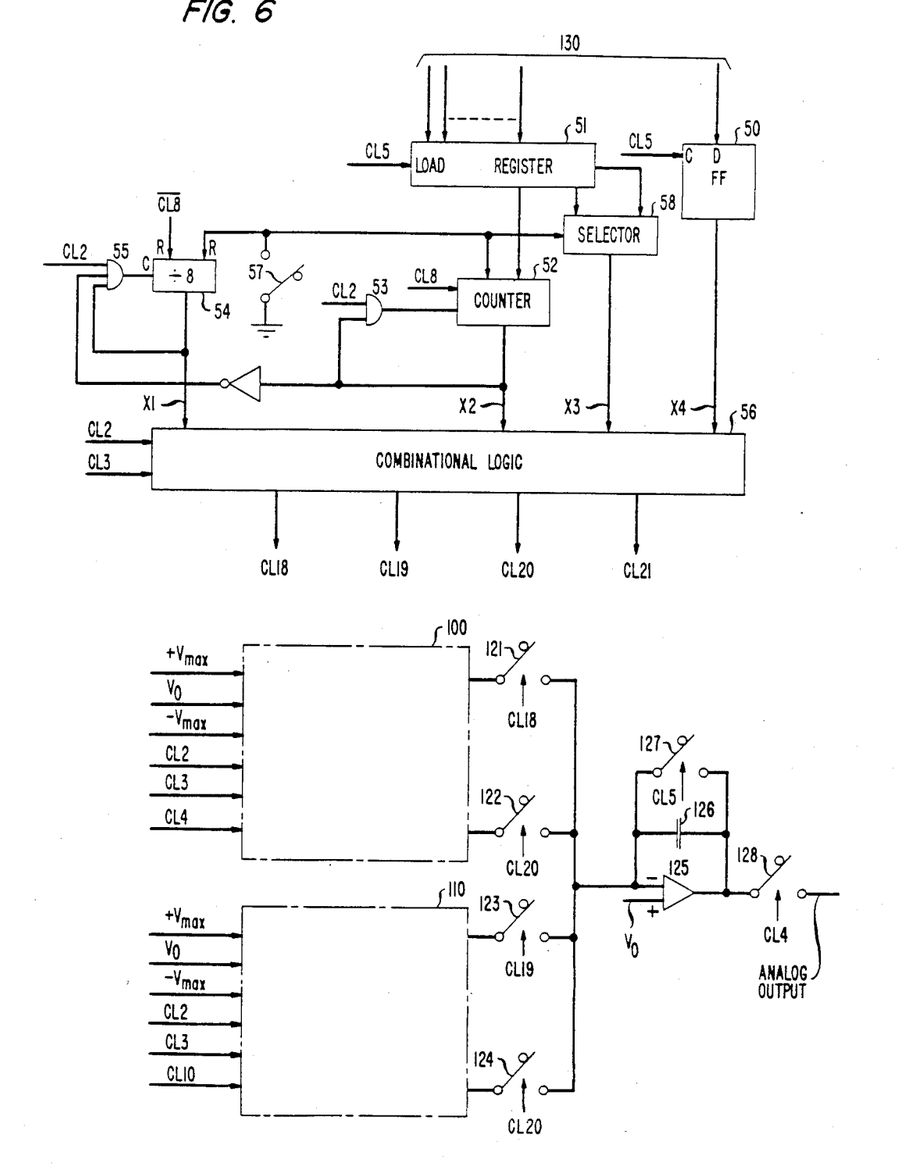
FIG. 6 is a block diagram of a decoder employing the principles of my invention.

One hardware realization of a decoder in accordance with the principles of my invention is depicted in FIG. 6. It is assumed in the FIG. 6 realization that control signal CL5 heralds the presence of the digital signal to be decoded and that the signal appears as a parallel input at lines 130. Of course, persons skilled in the art can convert the FIG. 6 embodiment to operating with a serial input.

Input signals to be decoded are applied to the digital portion of the FIG. 6 decoder at leads 130. The sign bit (for chord-law operation) is strobed into flip-flop 50 and the remaining bits are stored in register 51, both in response to the down transition of CL5. In linear operation the code output is derived serially from the rightmost bit of shift register 51, most significant bit first. In chord-law operation, the first three most significant bits in register 51 store the chord count, the fourth bit duplicates the sign bit of flip-flop 50 and the following four bits store the linear portion bits. The linear portion output is derived serially from the fourth bit of register 51.

Control signal CL8 loads the chord count output bits of register 51 into counter 52, which counts down the chords. This is accomplished through the connection of its output, which is "1" whenever the state of counter 52 is not zero, to its "down clock" input via AND gate 53. Counter 52 may be held at zero with switch 57, which is a user activated switch that is held open during chord-law operation.

Control signal CL8 resets counters 54 to zero. The output of counter 54, which is "1" whenever its state is not 4, is applied to AND gate 55. Gate 55 is also responsive to CL2 and to the inverted output of counter 52. As with counter 52, counter 54 can be held at zero with switch 57. This arrangement develops a "1" on lead x2 for all chords greater than zero beginning with the down transition of CL8 till counter 52 decrement to zero, and a "1" on lead x1 begins with the up transition of CL9 (and down transition of CL8) till four CL2 clock periods after counter 52 reaches state zero.

The output of flip-flop 50 (lead x4), the serial outputs of register 51 through selector 58 under control of switch 57 (lead x3), and the outputs of counter 52 and 54 (leads x2 and x1) are applied to combinatorial circuit 56. Circuit 56, which is also responsive to CL2 and CL7, develops the signals CL18 through CL21 for controlling the charge additions in the analog portion of the FIG. 6 decoder. Control signals CL18 and CL20 enable the addition of positive and negative binary reference charges, respectively, and control signals CL19 and CL21 enable the addition of the positive and negative 16 unit offset charges in chord-law operation. These signals are developed in circuit 56 in accordance with the Boolean expressions $$CL18 = (CL7)(x4) + [(x1)(x2)(x3) + (x1)(x2)(\overline{x4})]CL1$$

$$CL19 = (CL7)(\overline{x4})(\overline{x1})(\overline{x2})$$

$$CL20 = (CL7)(\overline{x4}) + [(x1)(\overline{x2})(x3) + (x1)(x2)(x4)]CL1$$

$$CL21 = (CL7)(x4)(\overline{x1})(\overline{x2})$$

The analog portion of the FIG. 6 decoder comprises reference voltage generators 100 and 110 (identical to similarly numbered elements in FIG. 3) and corresponding switches for applying the developed charges to a negative input of operational amplifier 125. Element 100 applies the positive developed binary reference charges through switch 121 under CL18 control and the negative developed binary reference charges through switch 122 under CL20 control. Element 110 applies the positive 16 unit charges through switch 123 under CL19 control and the negative 16 unit charges through switch 124 under CL21 control. The positive input of amplifier 125 is connected to $V_o$ and its output is fed back to its negative input through the parallel combination of capacitor 126 and switch 127.

The voltage across capacitor 126 builds up during the decoding process until it reaches its ultimate level just prior to the next digital input sample being processed. At that time, i.e., in coincidence with CL4, the output of amplifier 125 is sampled through switch 128 and, thereafter, capacitor 126 is discharged with switch 127 (under control of CL5) in preparation for the next decoding cycle.

The reader should appreciate that the embodiment described herein is merely illustrative of the principles of my invention and that other embodiments can be realized without departing from the principles thereof. For example, rather than develop the 16 unit voltage level charges with separate charge redistribution circuits, the binary reference generators already employed for the encoding or the decoding function can be sampled through a high impedance amplifier at the correct instance to obtain the required 16 unit voltage levels.

What is claimed is:

1. A binary reference voltage generator for iteratively developing a progression of reference voltages with each reference voltage being one half the previous voltage comprising:
   a first source capacitor for storing charges;
   a first reference-charge capacitor;
   first switch means for distributing the charges of said first source capacitor between said first source capacitor and said first reference-charge capacitor;
   second switch means for discharging said first reference-switch capacitor;
   third switch means for accessing and drawing the charge of said first reference-charge capacitor;
   fourth switch means for charging said first source capacitor at the beginning of each progression;
   first means for cyclically turning on and off said first and second switch means during each iteration;
   means for applying a positive maximum reference voltage to said first source capacitor;
   a second source capacitor for storing charges;
   a second reference-charge capacitor;
   fifth switch means for distributing the charges of said second source capacitor between said second source capacitor and said second reference-charge capacitor;
   sixth switch means for discharging said second reference-charge capacitor;
   seventh switch means for accessing and drawing the charge of said second reference-charge capacitor;
   eighth switch means for charging said second source capacitor;

second means for cyclically turning on and off said fifth and sixth switch means; and second means for applying a negative maximum reference voltage to said second source capacitor, equal in magnitude to said positive maximum reference voltage.

2. The apparatus of claim 1, further comprising:

means for sampling an applied analog signal at a predetermined sampling rate and placing developed analog samples on an encoding capacitor;

means for adding to said encoding capacitor at each iteration of said reference voltage generator the developed reference voltage of said first reference-charge capacitor when the polarity of voltage across said encoding capacitor is negative;

means for adding to said encoding capacitor at each iteration of said reference voltage generator the developed reference voltage of said second reference-charge capacitor when the polarity of voltage across said encoding capacitor is positive; and means for developing at each iteration of said reference-voltage generator an output bit of said encoder which is at one binary state when the polarity of voltage across said encoding capacitor is negative and which is at a second binary state when the polarity of voltage across said encoding capacitor is positive.

3. The apparatus of claim 1, responsive to a linearly encoded applied digital signal comprising bits having a first state and a second state and further comprising:

an output capacitor for storing an output voltage; and means, responsive to each bit of said applied digital signal for adding to the voltage of said output capacitor a reference voltage of said first reference-charge capacitor in response to said first state of said each bit, or a reference voltage of said second reference-charge capacitor in response to said second state of said each bit.

4. Apparatus of claim 2 further comprising:

means for determining the initial polarity of voltage across said encoding capacitor at commencement of each of said progressions and assigning a sign bit value based on said polarity;

means for increasing the magnitude of said analog samples by a preselected offset;

means for incrementing a chord count with each iteration of said reference voltage generator following assignment of said sign bit until the polarity of voltage across said encoding capacitor equals said polarity at time of sign bit assignment; and means for developing at each iteration following completion of said chord count, for a fixed number of iterations, an output bit of said encoder which is at one binary state when a reference voltage of said first reference-charge capacitor is added and which is at a second binary state when a reference voltage of said second reference-charge capacitor is added.

5. Apparatus of claim 1 further comprising:

means for placing on a capacitor an offset voltage having a polarity determined by the sign bit of a periodically applied chord-law encoded digital representation of sampled analog signals that includes a chord count and a linear code as well as the sign bit;

means for decrementing with each iteration of said reference voltage generator said chord count by one until said chord count reaches zero;

means for adding to said capacitor during chord count decrementing reference voltages of said first or second reference-charge capacitors based on the value of said sign bit; and means for adding to said capacitor, following said chord count decrementing, reference voltages of said first reference-charge capacitor in response to one state of corresponding bits in said linear count and adding reference voltages of said second reference-charge capacitor in response to the second state of corresponding bits in said linear count.

* * * * *